United States Patent

Baklanov et al.

(10) Patent No.: US 6,245,489 B1
(45) Date of Patent: Jun. 12, 2001

(54) FLUORINATED HARD MASK FOR MICROPATTERNING OF POLYMERS

(75) Inventors: Mikhail Rodionovich Baklanov; Serge Vanhaelemeersch, both of Leuven; Karen Maex, Herent; Joost Waeterloos, Leuven; Gilbert Declerck, Winksele, all of (BE)

(73) Assignee: Imec VZW, Leuven (BE)

( * ) Notice: Subject to any disclaimer, the term of this patent is extended or adjusted under 35 U.S.C. 154(b) by 0 days.

(21) Appl. No.: 09/085,691

(22) Filed: May 27, 1998

Related U.S. Application Data

(60) Provisional application No. 60/063,487, filed on Oct. 22, 1997, now abandoned.

(51) Int. Cl.[7] .................................................. G03F 7/26
(52) U.S. Cl. .............................. 430/313; 430/317; 216/41
(58) Field of Search ..................................... 430/312, 317, 430/313; 216/17, 41, 49

(56) References Cited

U.S. PATENT DOCUMENTS

| | | | | |
|---|---|---|---|---|
| 4,187,331 | * | 2/1980 | Ma ......................................... | 430/317 |
| 4,253,888 | * | 3/1981 | Kikuchi ................................ | 430/312 |
| 5,110,712 | * | 5/1992 | Kessler et al. ........................ | 430/313 |
| 5,215,867 | * | 6/1993 | Stillwagon et al. .................. | 430/313 |

* cited by examiner

Primary Examiner—Kathleen Duda
(74) Attorney, Agent, or Firm—Knobbe, Martens, Olson & Bear, LLP

(57) ABSTRACT

The present invention discloses the formation of a hard mask layer in an organic polymer layer by modifying at least locally the chemical composition of a part of said exposed organic low-k polymer. This modification starts from an exposed surface of the polymer and extends into the polymer thereby increasing the chemical resistance of the modified part of the polymer. As a result, this modified part can be used as a hard mask or an etch stop layer for plasma etching.

12 Claims, 2 Drawing Sheets a)

e)

b)

f)

c)

g)

d)

FLUORINATED HARD MASK FOR MICROPATTERNING OF POLYMERS

RELATED APPLICATIONS

The present application claims the benefit of priority under 35 U.S.C. §119(e) from Provisional Application No. 60/063,487, filed Oct. 22, 1997, abandoned.

FIELD OF THE INVENTION

The present invention is directed to the patterning of organic polymer films comprising phenyl groups. These polymer films are used, e.g., as inter- or intra-dielectric layers in semiconductor device fabrication for isolation purposes in multi-metal layer structures.

BACKGROUND OF THE INVENTION

The increasing complexity of integrated circuits, the growing number of metal levels and the focus on increasing speed of these circuits have created demands for low permittivity materials, particularly for use as inter-metal layers, i.e., used to isolate two metal levels from one another, or intra-metal layers, i.e., used to isolate metal patterns possibly formed within the same metal level one from another. Conventionally, metal interconnects, mostly aluminum layers, with silicon dioxide as a dielectric are used, but this conventional solution will not be able to meet the stringent specifications resulting from the above mentioned trends. Therefore, to avoid a large portion of the total circuit delay caused by the resistance and, particularly, the capacitance of the interconnect system, it is desirable to reduce the permittivity of the dielectric used. This is stated in numerous publications, e.g., in Table 1 of R. K. Laxman, "Low ∈ dielectric: CVD Fluorinated Silicon Dioxides", Semiconductor International, May 1995, pp. 71–74. A low ∈ material, a low K material and a material with a low permittivity are all alternative expressions for a material with a low dielectric constant, at least for the purposes of this disclosure. Therefore, miniaturization has lead to an intensified search for new low K materials. The most desirable material should have a low K value, low mechanical stress, high thermal stability and low moisture absorption. Furthermore, the desired material should be selected based on the compatibility with state-of-the-art semiconductor processing steps and tools.

Part of the search for new low K materials was directed to changing the properties of silicon dioxide as deposited. Deposited silicon dioxide is the most widely used dielectric inter- or intra-metal material having a K value of about 3.9. Several publications have indicated that the K value of silicon dioxide films can be reduced by introducing increasing amounts of fluorine in said films. A wide variety of processes to deposit fluorinated silicon oxide films are known, like, e.g., Plasma Enhanced Chemical Vapor Deposition (PECVD) process as in the U.S. Pat. No. 5,641,581. Using these processes K values in the range between 3 and 3.5 are reported to be dependent on the amount of fluorine atoms incorporated, i.e., an increasing amount of fluorine leads to a decrease in the K value.

Besides the focus on changing the properties of silicon oxide, there is an ongoing search for new low K materials amongst others because a K value of 3 is still too high. These new materials can be divided roughly in two groups: the inorganic low-K materials and the organic low-K materials. The inorganic low-K materials have mostly interesting K values below 2 or even below 1.5 like, e.g., xerogels, but these materials are mostly not compatible with the fabrication process of integrated circuits. The organic low-K materials, especially the organic spin-on materials, however, have a K-value typically in the range from 2.5 to 3. These organic materials are of particular interest because they feature simplified processing, excellent gap-fill and planarization.

The benefits of using such organic low-K spin-on materials are partly nullified by the need to introduce an inorganic hard mask layer for the patterning of an organic low-K spin-on material. For the purpose of this disclosure, a hard mask layer is defined as a layer which can be etched selectively to another layer and which therefore can be used as an etch mask to etch said other layer. Traditional lithographic resists are not suited to be used as hard mask layers for patterning organic low-K spin-on materials because these resists are also based on organic polymers resulting in an insufficient etch selectivity with regard to the organic low-K spin-on material. Conventionally, inorganic hard mask layers like silicon oxide or silicon nitride layer are used as described in, e.g., M. Schier, "RIE of BCB using a silicon nitride dielectric etch mask", J. Electrochem. Soc., v. 142, n9, p. 3238, 1995 and E. A. Lagendijk, et al., MRS Symp. Proc., v. 443, p. 177, 1997. These conventional inorganic hard mask layers have a rather high K value, i.e., typically in the range of 3.9 and above, which makes them less suitable for interconnect or isolation structures wherein the hard mask layers cannot be removed. Examples of such structures are damascene structures, where the hard mask layer can be positioned in-between two dielectric layers. If these dielectric layers are low-K organic layers part of the benefit of using such low-K layers is nullified because the K value of the inorganic hard mask layer contributes significantly to the mean value of the K value of the total dielectric stack comprising the hard mask layer and the two low K layers.

SUMMARY OF THE INVENTION

An aim of the present invention is to form a hard mask layer in an organic polymer layer by modifying at least locally the chemical composition of a part of an exposed organic low-K polymer. The polymer comprises phenyl groups. This modification starts from an exposed surface of the polymer and extends into the polymer thereby increasing the chemical resistance of the polymer. As a result, this modified part can be used as a hard mask for plasma etching. This modification is performed by exposing the low-K polymer to an ambient comprising fluorine, substantially without changing the film thickness, i.e., substantially without etching the low-K polymer. By doing so, the use of an extra hard mask layer, particularly an inorganic hard mask layer, can be avoided or at least removed subsequently. Furthermore, the mean K value even decreases due to the fluorination.

In one aspect of the invention a method is disclosed to form a hard mask layer in an organic polymer layer by modifying at least partly the chemical composition of a first region of an organic polymer film. The first region is uncovered. This modification is performed by exposing a surface of the organic polymer film to an environment comprising fluorine substantially without changing the thickness of the first region of the organic polymer film. As a result a part of the first region of the organic polymer film is fluorinated leading to an increase in chemical resistance and a decrease in the K value of that part. That part starts at a surface of the first region and extends in the polymer film with elapsing exposure time. Thereafter, a layer, forming a diffusion barrier for fluorine and covering the surface of a second region, is removed from the second region, yielding the organic polymer film comprising the first region and the second region, wherein a surface of the first region and a surface of the second region are exposable. Thereafter, an etching procedure can be applied on the organic polymer film to remove selectively at least a part of the second region using the first region as a hard mask.

According to this aspect of the invention, a method for patterning an organic polymer film is disclosed. The method comprises the steps of: defining at least one first region and at least one second region in an organic polymer film formed on a substrate, the first region being uncovered and the second region being covered with a layer forming a diffusion barrier for fluorine; exposing the first and the second region to an ambient comprising fluorine resulting in the fluorination of at least a part of the first region; removing the barrier layer; selectively removing at least a part of the second region by etching, using the first region as a mask.

In an embodiment of the invention the exposure of the organic polymer film to fluorine is performed in a plasma ambient comprising fluorine. The conditions of the plasma ambient are such that damaging, i.e., etching, of the first region of the organic polymer film is avoided. As a consequence, the thickness of the partly fluorinated organic polymer layer remains substantially unchanged compared to the pristine one. Preferably, the plasma is a fluorine based plasma, where the fluorine source is selected from the group comprising $NF_3$, $SF_6$, $ClF_3$, $F_2$, $XeF_2$, $C_xF_y$, with x and y being positive whole numbers greater than zero.

In another embodiment of the invention a method is disclosed, wherein the organic polymer comprises at least one phenyl group. Particularly, the organic polymer can be selected from a group comprising benzocyclobutarenes, poly arylene ether, aromatic hydrocarbon, and polyimides. Phenyl groups comprise carbon-hydrogen bonds, which can easily be attacked by reactive species, such as atomic fluorine generated in a plasma or other ambient comprising active fluorine. The active fluorine can abstract hydrogen from carbon in the phenyl groups. As a result, at least a part of the organic polymer layer is fluorinated leading to a lower permittivity value compared to a pristine one, and a higher chemical resistance especially in regard to an oxygen or an oxygen-fluorine based RIE (reactive ion etch) plasma.

In another aspect of the invention, a method for forming a patterned hard mask layer in an organic polymer film is disclosed. The method comprises the steps of: fluorinating a part of an organic polymer film, the fluorinated part forming a first hard mask layer; forming a patterned second hard mask layer on the film; patterning the first hard mask layer using the patterned second hard mask layer as a mask; removing the second hard mask layer; and etching the organic polymer film using the patterned first hard mask layer as a mask.

According to the present invention, the method for forming a patterned hard mask layer in an organic polymer film can be used in the process of fabricating integrated circuits and particularly for the fabrication of devices comprising interconnect structures.

The He flow was kept constant and equal to 65 sccm. The flows of $NF_3$ and $O_2$ were chosen complementary and were varied between 0 and 50 sccm, whereby the sum of the $NF_3$ flow and the $O_2$ flow was kept constant and equal to 50 sccm. The percentage of $NF_3$ in the figure is the relative amount of $NF_3$ compared to the amount of $NF_3$ and $O_2$ without taking into account He.

Figure 2:
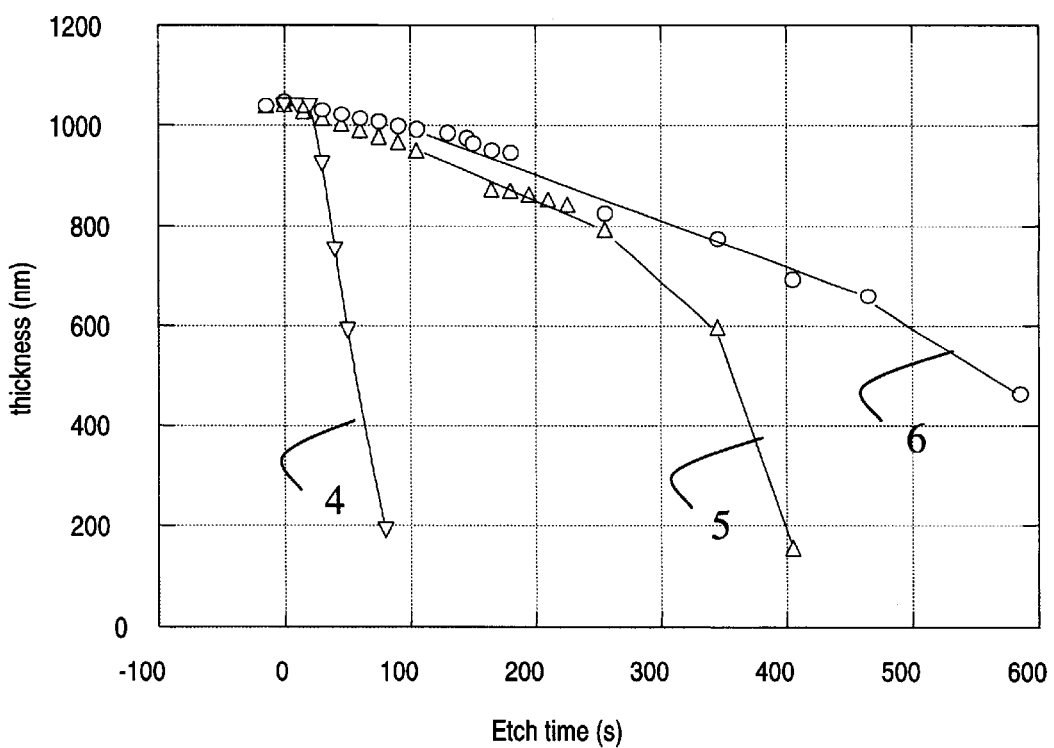

FIG. 2 represents, according to an embodiment of the invention, the etch time versus the film thickness of three SiLK films, i.e., a pristine SiLK film (4) and two fluorinated SiLK films, i.e., which were exposed in a $NF_3$ ambient, respectively, with a fluorination time of 5 seconds (5) and 10 seconds.(6)

Figure 3:
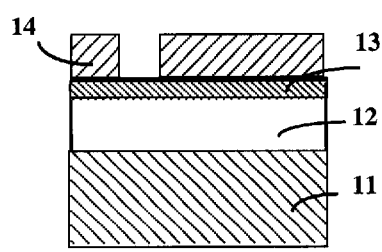
Figure 3:
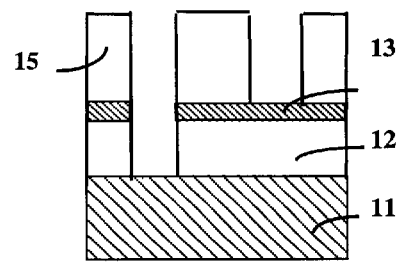
Figure 3:
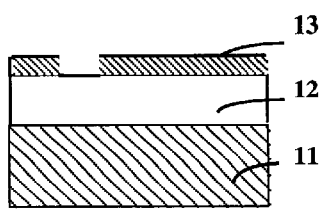
Figure 3:
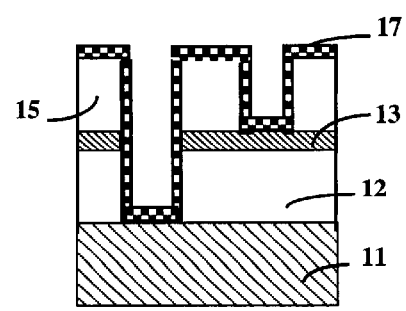
Figure 3:
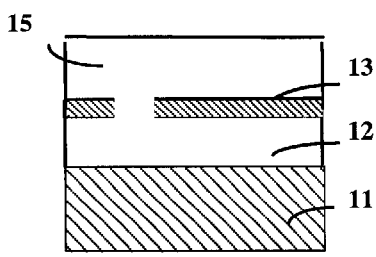
Figure 3:
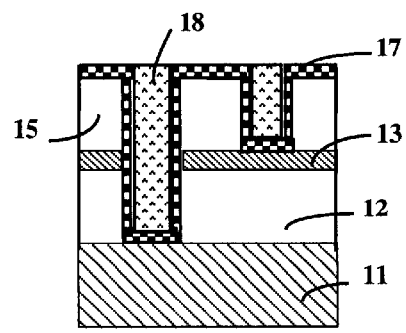
Figure 3:
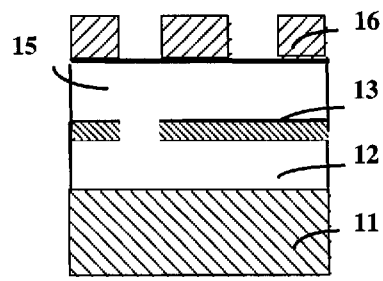

FIG. 3 represents, according to an embodiment of the invention, a detailed description of the processing steps involved to create a particular interconnect structure.

DETAILED DESCRIPTION OF THE PREFERRED EMBODIMENT

In relation to the appended drawings, the present invention is described in detail. It is apparent, however, that a person skilled in the art can imagine several other equivalent embodiments or other ways of executing the present invention, the spirit and scope of the present invention being limited only by the terms of the appended claims.

In one aspect of the invention, a method is disclosed to form a hard mask layer in an organic polymer film by modifying at least partly the chemical composition of a first region of an organic polymer film comprising at least one phenyl group. Perferably, the first region is uncovered. If desirable, the first region can also be covered with suitable materials which do not adversely affect the fluorination of the polymer film. This modification is performed by exposing a surface of the organic polymer film to an ambient comprising fluorine substantially without changing the thickness of the first region of the organic polymer film. Phenyl groups comprise carbon-hydrogen bonds, which can be attacked by reactive species, such as atomic fluorine generated in a plasma or another ambient comprising active fluorine. The active fluorine can abstract hydrogen from carbon in the phenyl groups. Therefore, the method involves a formal replacement of hydrogen by fluorine. Furthermore, due to the small size of the fluorine atoms, they can easily diffuse through the organic polymer film. Consequently, the replacement of hydrogen by fluorine is not limited to the surface layer of the film but also extends further into the film. Fluorine is the most electronegative and the least polarizable element on the periodic table. The incorporation of fluorine in the organic polymer film makes the film less polarizable. As a result, a part of the first region of the organic polymer film is fluorinated leading to an increase in chemical resistance and a decrease of the K value of that part, that part starts at a surface of the first region and extends in the polymer film with elapsing exposure time.

Thereafter, a layer forming a diffusion barrier for fluorine and covering a surface of the second region is removed from the second region, yielding the organic polymer film comprising the first region and the second region, wherein a surface of the first region and a surface of the second region are exposable. Thereafter, an etching procedure can be applied on the organic polymer film to remove selectively at least a part of the second region using the first region as a hard mask.

According to this aspect of the invention, a method for patterning an organic polymer film is disclosed. The method comprises the steps of: defining at least one first region and at least one second region in an organic polymer film formed on a substrate, the polymer film comprising at least one phenyl group, the first region being uncovered and the second region being covered with a layer forming a diffusion barrier for fluorine; exposing the first and the second region to an ambient comprising fluorine resulting in the fluorination of at least a part of the first region; removing the barrier layer; selectively removing at least a part of the second region by etching, using the first region as a mask.

In an embodiment of the invention, the exposure of the organic polymer film to fluorine is performed in a plasma ambient comprising fluorine. The conditions of the plasma ambient are such that damaging, i.e., etching, of the first region of the organic polymer film is avoided. As a consequence, the thickness of the partly fluorinated organic polymer layer remains substantially unchanged compared to the pristine one. Preferably, the plasma is a fluorine based plasma, where the fluorine source is selected from the group comprising $NF_3$, $SF_6$, $ClF_3$, $F_2$, $XeF_2$, $C_xF_y$, with x and y being positive whole numbers greater than zero.

In another embodiment of the invention, a method is disclosed wherein the organic polymer film comprising at least one phenyl group is selected from a group comprising benzocyclobutarenes, e.g., benzocyclobutene (BCB) commercially available as Cyclotene 5021™, poly arylene ether, e.g., FLARE™ II, aromatic hydrocarbon, i.e., SiLK™, and polyimides. Phenyl groups comprise carbon-hydrogen bonds, which can easily be attacked by reactive species, such as atomic fluorine generated in a plasma or other ambient comprising active fluorine. The active fluorine can abstract hydrogen from carbon in the phenyl groups. As a result, at least a part of the organic polymer layer is fluorinated leading to a lower permittivity value compared to a pristine one, and a higher chemical resistance especially in regard to an oxygen-fluorine based RIE (reactive ion etch) plasma. By doing so, the K-values can be lowered yielding a range from 2 to 2.5 instead of from 2.5 to 3.

In another embodiment of the invention, an organic polymer film comprising phenyl groups is formed on a substrate like, e.g., a semiconductor wafer such as a silicon or a SiGe or a GaAs wafer, or a nonconductive slice such as a glass slice. After curing the film and defining the first region and the second region in the film, the film is exposed to a fluorine based ambient with an amount of atomic fluorine typically in the range from $10^{12}$ to $10^{13}$ $cm^{-3}$, preferably in the range from $10^{14}$ to $10^{17}$ $cm^{-3}$. Preferably, the process conditions are such that the surface temperature of the exposed polymer film is between 10° C. and 200° C. or, more preferably, between 30° C. and 100° C. The exposure time is typically in the order of minutes, e.g., between 0.1 and 30 minutes, preferably between 1 and 5 minutes. But the invention is not limited hereto. The thickness of the polymer film can be in the range from 0.01 to 50 micrometer, preferably in the range from 0.01 to 1 micrometer, more preferably, in the range from 0.5 to 5 micrometer.

Figure 1:
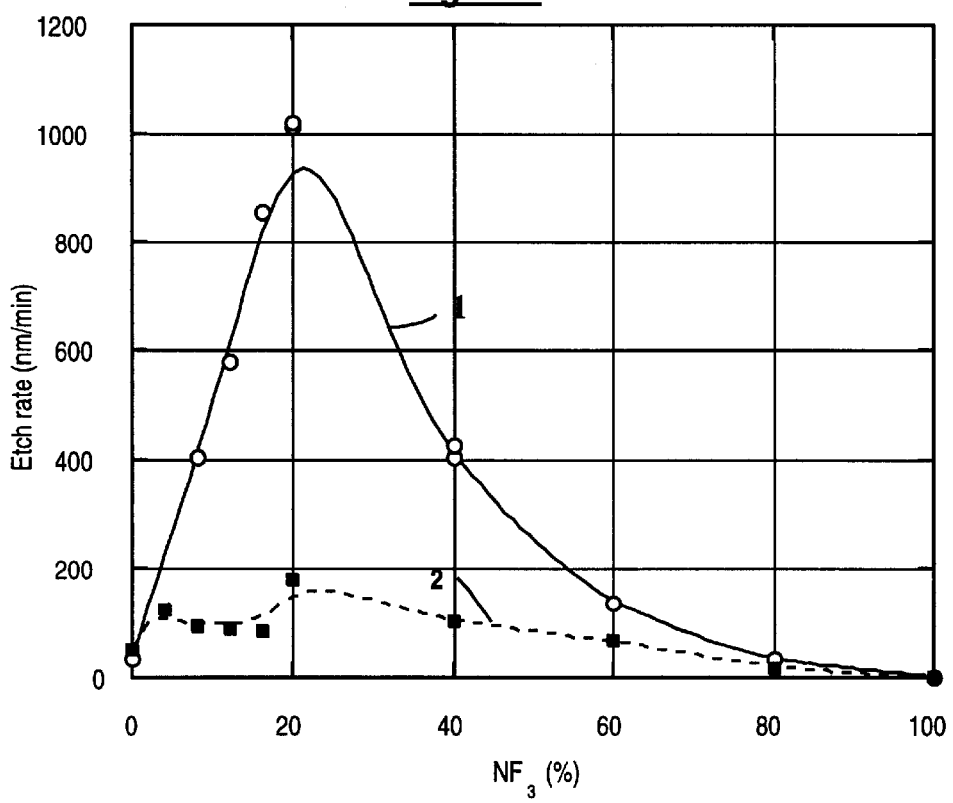
FIG. 1 represents, according to an embodiment of the invention, the etch rate of BCB (Cyclotene 5021™) in a plasma ambient comprising a mixture of $NF_3$, $O_2$ and He versus the percentage of $NF_3$. The total gas flow was 115 sccm, whereas the pressure in the chamber was 1.30 Torr.

In an embodiment of the invention, as a first example, an organic polymer film, i.e. a SiLK film, is deposited on top of a silicon wafer. This substrate is exposed to an ambient comprising fluorine, i.e. a $NF_3$ plasma afterglow in a plasma etcher, i.e. Matrix 303, in order to modify the chemical composition of a part of the SiLK film. The thickness and the refractive index of the film are monitored using an interferometer, e.g. Spectramap SM300, and a laser ellipsometer, e.g. Plasmos-2002. First, it is observed that this organic low-k dielectric SiLK film is substantially not etched by the $NF_3$ afterglow, e.g. the thickness of the film, remains substantially the same. This is also observed for BCB films and Flare-II films. Furthermore, it is observed that this exposure affects only a part of the film, the part starting at the exposed surface of the film and extending into the film. This process, i.e. the fluorination of the part of the SiLK film, leads to a change of refractive index and chemical composition of the fluorinated part of the SiLK film. This is also observed for BCB films and Flare-II films. As depicted in FIG. 1, the etch rate for etching a fluorinated BCB film (2) in a $O_2/NF_3$ plasma can be substantially lower than the etch rate for etching pristine BCB films (1), depending on the $O_2/NF_3$ ratio. In general, the etch rate ratio of a fluorinated polymer to a pristine one in an oxygen-fluorine plasma depends on the atomic fluorine concentration in the plasma. For example (FIG. 1), the etch rate ratio of a fluorinated BCB layer to a pristine one in an oxygen-fluorine plasma, where the fluorine source is $NF_3$, has a maximum corresponding with a $NF_3$ concentration of about 20% in the plasma. Consequently an etch rate ratio of about 5 is obtained. Because the etch rate ratio is mainly dependent on the atomic fluorine concentration, similar etch rate ratios can be obtained for other fluorine sources and for other organic films comprising phenyl groups.

Furthermore, it is observed that the thickness of the fluorinated part of the film depends on the atomic fluorine concentration, the fluorination time, i.e. the exposure time, and the temperature. This observation confirms the expectations because the fluorination is a diffusion limited process. Consequently, the thickness of the fluorinated film can be easily controlled by varying one of the aforementioned parameters. Particularly, FIG. 2 depicts, according to the example, the etch time versus the film thickness of three SiLK films, i.e. a pristine SiLK film (4) and two fluorinated SiLK films respectively with a fluorination time of 5 seconds (5) and 10 seconds.(6) The etch rate is significantly lower for the fluorinated SiLK films compared to the pristine one. Regarding the fluorinated SiLK films one can observe that the etch rate for both films is substantially the same up to a remaining thickness of about 800 nm (or an etch time of about 300 seconds). Afterwards the etch rate, i.e. the removal rate, of the SiLK film, being fluorinated during 5 seconds (5), is much higher than the etch rate for the SiLK film, being fluorinated during 10 seconds (6). This clearly indicates that the fluorinated part of the SiLK film, being fluorinated during 5 seconds, had a thickness of about 200 nm and that this is substantially thinner than the fluorinated part of the SiLK film, being fluorinated during 10 seconds. Due to the easy control of the thickness of the fluorinated part of the film, this fluorinated part can be used as a hard mask layer for polymer patterning.

In another embodiment of the invention, as a second example (FIG. 3), a detailed description of the processing steps involved to create a particular isolation or interconnect structure is given indicating the specific advantages of the use of a fluorinated hard mask layer in comparison to conventional used structures. It should be clear however that the invention is not limited to this particular structure but the present invention can be applied for any isolation or interconnect structure comprising organic polymer layers and where a hard mask layer is used for patterning these polymer layers.

On a flattened substrate, e.g. a silicon wafer (11), a first dielectric layer (12), e.g. an organic polymer layer comprising phenyl groups is formed. Examples of such polymers are benzocyclobutarenes such as benzycyclobutene (BCB) commercially available as Cyclotene 5021™, poly arylene ether such as FLARE™ II, aromatic hydrocarbon such as SiLK™, and polyimides.

A patterned hard mask layer is formed in this organic polymer film according to a method of the invention. Particularly, first a part of this organic polymer film is fluorinated by exposure to an ambient comprising fluorine, the fluorinated part forming a first hard mask layer (13). By doing so the thickness of the organic polymer layer remains substantially unchanged and the K-value even decreases. Then a patterned second sacrificial hard mask layer (14), e.g. a silicon nitride layer, is formed thereon (FIG. 3, step a)). Further, the first hard mask layer is patterned (FIG. 3, step b)) using the patterned second hard mask layer as a mask and thereafter the second hard mask layer is removed.

A second dielectric layer, e.g. an organic polymer layer, (15) is formed (step c)) over the patterned hard mask layer and a resist layer (16) is formed on this second dielectric layer. The resist layer is patterned (step d)) and the second dielectric layer is etched using the patterned resist layer as a mask which can result in the formation of a trench. The first hard mask layer functions as an etch stop layer thereby preventing the extension from the trench in the first dielectric layer (step e)). The first dielectric layer is then etched using the patterned first hard mask layer as a mask to form a contact to the substrate, i.e. exposing the surface of the substrate (step e)). Alternatively instead of forming a contact to the substrate, also a contact to a conductive layer can be formed. The etching of the first and second dielectric layer can be performed using a single etch step or two etch steps. The patterned resist layer is removed.

A conductive layer, e.g. an alloy of or pure Al, Cu, Ag, Pt, Co, Ti, Ni or Au, or a combination of a conductive layer (18) and a barrier layer (17), like e.g. a Ti-containing layer or a Co-containing or a Ni-containing layer, can be deposited (steps f) and g)) thereby filling the contact in the first and second dielectric layer and the trench in the second dielectric layer.

According to a state of the art method, instead of fluorinating the first dielectric layer to form a first hard mask layer in the organic polymer film, a structural hard mask layer is formed on the dielectric layer. The thickness of the hard mask layer is determined by the RIE step for the patterning of the organic polymer and by the reflections of the lithographic resist mask during exposure. The thickness is typically 0.03 $\mu$m or more. This patterned hard mask layer may not be removed. The two clear disadvantages thereof are: the total thickness of the stack of insulating layers increases and the K-value of most inorganic hard mask layers is substantially higher than the K value of an organic polymer. Both disadvantages negatively influence the inter- and intra-metal capacitance.

In another embodiment of the invention, as a third example, a detailed description of the processing steps involved to create a particular interconnect structure is given.

An interconnect pattern is created in a conductive layer on a flattened substrate. This pattern is made by blanket deposition of Ti, TiN, alloyed or pure Al or alloyed or pure Cu or any low resistive metal patterned using a RIE step with a lithographic developed resist as a mask. After the RIE step the resist left-over is removed using a solvent stripper combined with an isotropic oxygen plasma.

Next the isolator, which is an organic polymer comprising phenyl groups, is applied by spin coating, followed by a densification step such as a furnace anneal at 350° C. for 30 minutes in a nitrogen ambient. The organic polymer will provide the necessary electrical isolation between the interconnect patterns and will provide the necessary flatness for the deposition of the next level. The thickness of the organic polymer is typically about 1 $\mu$m. The organic polymer used is Cyclotene 5021™ from Dow Chemical. The chemical formulation is divinyl siloxane benzocyclobutane. Since the isolator is an organic polymer layer it is possible to pattern the isolator with an oxygen based RIE.

For the patterning of the organic polymer layer a hard mask layer is formed in the organic polymer layer as follows. After deposition and patterning of a resist layer, which forms a diffusion barrier for fluorine, the organic polymer layer is partly fluorinated by exposure to an ambient comprising fluorine thereby creating a patterned hard mask layer. The resist layer is removed. The organic polymer is etched using oxygen based plasma chemistry and using the patterned hard mask layer as a mask.

After patterning of the organic polymer, the subsequent conductive level is implemented. A wet or a dry clean or a combination of a wet and a dry clean is performed. A barrier layer such as Ti, TiN, Ta, TaN is formed by means of a chemical or physical vapor deposition technique, followed by a metal deposition and an etch back.

Finally a conductive layer is deposited using an alloy of pure Al, Cu, Pt, Ti, Ni, Co, Au or Ag, patterned and capped by a Ti-containing layer or a Co-containing layer or a Ni-containing layer.

What is claimed is:

1. A method for forming a patterned hard mask layer in an organic dielectric polymer film comprising the steps of:

fluorinating a part of the organic polymer film, thereby forming a fluorinated part, said fluorinated part forming a first hard mask layer;

forming a patterned second hard mask layer on said film;

etching said first hard mask layer to substantially expose said organic dielectric polymer using said patterned second hard mask layer as a mask, thereby forming a patterned first hard mask layer;

removing said second hard mask layer; and etching said organic polymer film using said patterned first hard mask layer as a mask, wherein at least a part of said first hard mask layer is retained as a dielectric layer.

2. A method as recited in claim 1, wherein said organic polymer film comprises an organic polymer having at least one phenyl group.

3. A method as recited in claim 2, wherein said organic polymer film is selected from the group consisting of benzocyclobutarenes, poly arylene ether, aromatic hydrocarbon, and polyimides.

4. A method as recited in claim 1, wherein the fluorinating step is performed in an ambient comprising fluorine without substantially changing the thickness of said organic polymer layer.

5. A method as recited in claim 4, wherein said fluorine is generated from a source selected from the group consisting of $NF_3$, $SF_6$, $ClF_3$, $F_2$, $XeF_2$, and $C_xF_y$, with x and y being positive whole numbers greater than zero.

6. A method as recited in claim 1, wherein said second hard mask layer is selected from the group consisting of oxides, nitrides and oxynitrides.

7. The method of claim 1, wherein said patterned second hard mask is formed by the steps of:

providing a second hard mask;

applying a photoresin to said second hard mask;

exposing said photoresin;

developing said photoresin;

etching said second hard mask using said exposed and developed photoresin as a mask; and removing said photoresin so as to yield a patterned second hard mask.

8. A method for patterning an organic polymer film, comprising the steps of:

defining at least one first region and at least one second region in an organic polymer film formed on a substrate, said first region being uncovered and said second region being covered with a layer forming a diffusion barrier for fluorine;

exposing said first and said second region to an ambient comprising fluorine resulting in the fluorination of at least a part of said first region, thereby forming a fluorinated part;

removing said layer;

selectively removing at least a part of said second region by etching, using said first region as a mask, wherein at least a part of said fluorinated part is retained as a dielectric layer.

9. A method as recited in claim 8, wherein said organic polymer film comprises an organic polymer having at least one phenyl group.

10. A method as recited in claim 9, wherein said organic polymer is selected from the group consisting of benzocyclobutarenes, poly arylene ether, aromatic hydrocarbon, and polyimides.

11. A method as recited in claim 8, wherein said layer forming a diffusion barrier for fluorine is selected from the group consisting of resists, oxides, nitrides and oxynitrides.

12. An integrated circuit comprising an interconnect structure, wherein the process of forming said interconnect structure comprises a method for forming a patterned hard mask layer in an organic polymer film, said method comprising the steps of:

fluorinating a part of the organic polymer film, said fluorinated part forming a first hard mask layer;

forming a patterned second hard mask layer on said film;

patterning said first hard mask layer using said patterned second hard mask layer as a mask;

removing said second hard mask layer; and etching said organic polymer film using said patterned first hard mask layer as a mask.

* * * * *